(12) United States Patent
Horak et al.

(10) Patent No.: US 10,134,631 B2
(45) Date of Patent: Nov. 20, 2018

(54) SIZE-FILTERED MULTIMETAL STRUCTURES

(71) Applicant: International Business Machines Corporation, Armonk, NY (US)

(72) Inventors: David V. Horak, Essex Junction, VT (US); Charles W. Koburger, III, Delmar, NY (US); Shom Ponoth, Newport Beach, CA (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/077,157

(22) Filed: Mar. 22, 2016

(65) Prior Publication Data

US 2016/0204064 A1   Jul. 14, 2016

Related U.S. Application Data

(60) Continuation-in-part of application No. 14/069,959, filed on Nov. 1, 2013, now Pat. No. 9,484,254, which
(Continued)

(51) Int. Cl.
*H01L 23/525* (2006.01)
*H01L 21/768* (2006.01)
(Continued)

(52) U.S. Cl.
CPC .. *H01L 21/76877* (2013.01); *H01L 21/76814* (2013.01); *H01L 23/528* (2013.01);
(Continued)

(58) Field of Classification Search
CPC .......... H01L 27/1026; H01L 27/11206; H01L 23/5256; H01L 21/76844; H01L 21/76846;
(Continued)

(56) References Cited

U.S. PATENT DOCUMENTS

| 4,227,168 A | 10/1980 | Knapp, Jr. |
|---|---|---|
| 4,228,417 A | 10/1980 | Belcher |

(Continued)

*Primary Examiner* — Davienne Monbleau
*Assistant Examiner* — Leslie Pilar Cruz
(74) *Attorney, Agent, or Firm* — Scully, Scott, Murphy & Presser, P.C.; Steven J. Meyers

(57) ABSTRACT

A size-filtered metal interconnect structure allows formation of metal structures having different compositions. Trenches having different widths are formed in a dielectric material layer. A blocking material layer is conformally deposited to completely fill trenches having a width less than a threshold width. An isotropic etch is performed to remove the blocking material layer in wide trenches, i.e., trenches having a width greater than the threshold width, while narrow trenches, i.e., trenches having a width less than the threshold width, remain plugged with remaining portions of the blocking material layer. The wide trenches are filled and planarized with a first metal to form first metal structures having a width greater than the critical width. The remaining portions of the blocking material layer are removed to form cavities, which are filled with a second metal to form second metal structures having a width less than the critical width.

13 Claims, 9 Drawing Sheets

Related U.S. Application Data is a division of application No. 13/211,351, filed on Aug. 17, 2011.

(51) Int. Cl.
*H01L 23/528* (2006.01)
*H01L 23/532* (2006.01)

(52) U.S. Cl.
CPC .... *H01L 23/5256* (2013.01); *H01L 23/53238* (2013.01); *H01L 23/53266* (2013.01); *H01L 2924/0002* (2013.01)

(58) Field of Classification Search
CPC ..... H01L 2221/1073; H01L 2221/1078; H01L 21/76843
See application file for complete search history.

(56) References Cited

U.S. PATENT DOCUMENTS

| | | | |
|---|---|---|---|
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 5,960,254 A | 9/1999 | Cronin | |
| 6,162,686 A * | 12/2000 | Huang | H01L 23/5258 257/503 |
| 6,261,873 B1 * | 7/2001 | Bouldin | H01L 23/5258 257/E23.15 |
| 6,433,404 B1 | 8/2002 | Iyer et al. | |
| 6,555,458 B1 | 4/2003 | Yu | |
| 6,754,135 B2 | 6/2004 | Pilo | |
| 6,803,306 B2 | 10/2004 | Tsau | |
| 6,894,393 B1 | 5/2005 | Rusher | |
| 6,897,543 B1 | 5/2005 | Huang et al. | |
| 6,998,865 B2 | 2/2006 | Bard et al. | |
| 7,157,782 B1 | 1/2007 | Shih et al. | |
| 7,176,090 B2 | 2/2007 | Brask et al. | |
| 7,272,067 B1 | 9/2007 | Huang et al. | |
| 7,298,639 B2 | 11/2007 | Hsu et al. | |
| 7,737,528 B2 | 6/2010 | Bonilla et al. | |
| 7,893,520 B2 | 2/2011 | Yang et al. | |
| 2001/0030366 A1 * | 10/2001 | Nakano | H01L 21/288 257/758 |
| 2003/0168714 A1 * | 9/2003 | Daubenspeck | H01L 23/5256 257/529 |
| 2004/0053487 A1 * | 3/2004 | Jeng | H01L 23/5258 438/601 |
| 2004/0173905 A1 | 9/2004 | Kamoshima et al. | |
| 2005/0098803 A1 * | 5/2005 | Komatsu | H01L 23/5228 257/232 |
| 2005/0239273 A1 * | 10/2005 | Yang | H01L 23/5258 438/601 |
| 2006/0189129 A1 | 8/2006 | Baskaran et al. | |
| 2007/0052515 A1 * | 3/2007 | Ueda | H01L 23/5256 337/401 |
| 2007/0063313 A1 * | 3/2007 | Barth | H01L 23/5256 257/529 |
| 2007/0210414 A1 | 9/2007 | Iwamoto et al. | |
| 2008/0105948 A1 * | 5/2008 | Jeng | H01L 23/5256 257/529 |
| 2008/0174022 A1 * | 7/2008 | Chen | H01L 21/76808 257/752 |
| 2009/0090998 A1 | 4/2009 | Woo | |
| 2009/0102057 A1 | 4/2009 | Kageyama et al. | |
| 2009/0174045 A1 | 7/2009 | Arvin et al. | |
| 2009/0251275 A1 * | 10/2009 | Tsuda | H01L 23/5256 337/290 |
| 2009/0273056 A1 | 11/2009 | Ohkubo et al. | |
| 2010/0133660 A1 | 6/2010 | Huyghebaert et al. | |
| 2011/0024872 A1 * | 2/2011 | Kim | H01L 23/5258 257/529 |
| 2011/0101493 A1 | 5/2011 | Wu et al. | |

\* cited by examiner

SIZE-FILTERED MULTIMETAL STRUCTURES

BACKGROUND

The present disclosure relates to interconnect level structures and particularly to size-filtered multimetal structures in which metal lines having different widths have different metallic compositions, an electrically programmable fuse (eFuse) employing a different material for a metallic fuselink than for a metallic anode and a metallic cathode, and methods of manufacturing the same.

Interconnect level structures, which are also referred to as back-end-of-line (BEOL) interconnect structures, are employed in semiconductor chips to provide horizontal and vertical electrical connections among various semiconductor devices and/or between semiconductor devices and input/output pads that are connected to pins on a packaging substrate. Metal lines provide horizontal electrical connection, and metal vias provide vertical interconnection. Metal lines and metal vias are embedded in dielectric layers, which are located on a semiconductor substrate on which various semiconductor devices are formed.

Various types of additional metal structures can be formed in the dielectric layers. Such additional metal structures include, but are not limited to, capacitors, inductors, resistors, and electrical fuses. An electrical fuse formed as a metal interconnect structure, which is herein referred to as a metallic electrical fuse, requires much less device area than a metal-silicide-based electrically programmable fuse.

Different metal structures in dielectric layers and/or different components of a metal structure may require different properties for optimal performance. For example, a metallic electrical fuse requires an anode structure and a cathode structure that are resistant to electromigration and an electromigratable fuselink. Thus, integration of various metallic device components within the same level of metal interconnect structure may require compromise among various device performance requirements.

BRIEF SUMMARY

A size-filtered metal interconnect structure allows formation of metal structures having different compositions. Trenches having different widths are formed in a dielectric material layer. A blocking material layer is conformally deposited to completely fill trenches having a width less than a threshold width. An isotropic etch is performed to remove the blocking material layer in wide trenches, i.e., trenches having a width greater than the threshold width, while narrow trenches, i.e., trenches having a width less than the threshold width, remain plugged with remaining portions of the blocking material layer. The wide trenches are filled and planarized with a first metal to form first metal structures having a width greater than the critical width. The remaining portions of the blocking material layer are removed to form cavities, which are filled with a second metal to form second metal structures having a width less than the critical width.

According to an aspect of the present disclosure, a structure is provided. The structure includes a dielectric layer located on a substrate, a first metallic structure located within a first trench that is embedded in the dielectric layer and has a first width greater than a threshold distance. The first metallic structure includes a first metallic portion including a first metallic material. The structure further includes a second metallic structure located within a second trench that is embedded in the dielectric layer and has a second width equal to or less than the threshold distance. The second metallic structure includes a second metallic portion composed of a second metallic material having a lower electromigration resistance and a lower electrical resistivity than the first metallic material. The first metallic structure fills an entirety of the first trench, and the second metallic structure fills an entirety of the second trench.

According to another aspect of the present disclosure, a structure including an electrically programmable fuse (eFuse) is provided. The eFuse is embedded in a dielectric layer located on a substrate and includes an assembly of a metallic anode, a metallic fuselink, and a metallic cathode. The metallic anode includes a first metallic portion located in a first trench that is embedded in the dielectric layer and including a first metallic material, the metallic cathode comprises a second metallic portion located in a second trench that is embedded in the dielectric layer and including the first metallic material, and the metallic fuselink contacts the metallic anode and the metallic cathode and includes a third metallic portion located in a third trench that is embedded in the dielectric layer and including a second metallic material having a lower electromigration resistance and a lower electrical resistivity than the first metallic material. The metallic anode has a first width greater than a threshold distance, the metallic cathode has a second width greater than the threshold distance, and the metallic fuselink has a third width equal to or less than the threshold distance. The metallic anode fills an entirety of the first trench, the metallic cathode fills an entirety of the second trench, and the metallic fuselink fills an entirety of the third trench.

BRIEF DESCRIPTION OF THE SEVERAL VIEWS OF THE DRAWINGS

In the present disclosure, drawings that are labeled with the same numeric label represent the same stage of a manufacturing process. Drawings that are labeled with the suffix "A" are top-down views. Drawings that are labeled with the suffix "B" are vertical cross-sectional views along a vertical plane B-B' in the top-down view labeled with the same numeric label and the suffix "A."

DETAILED DESCRIPTION

Figure 1A:
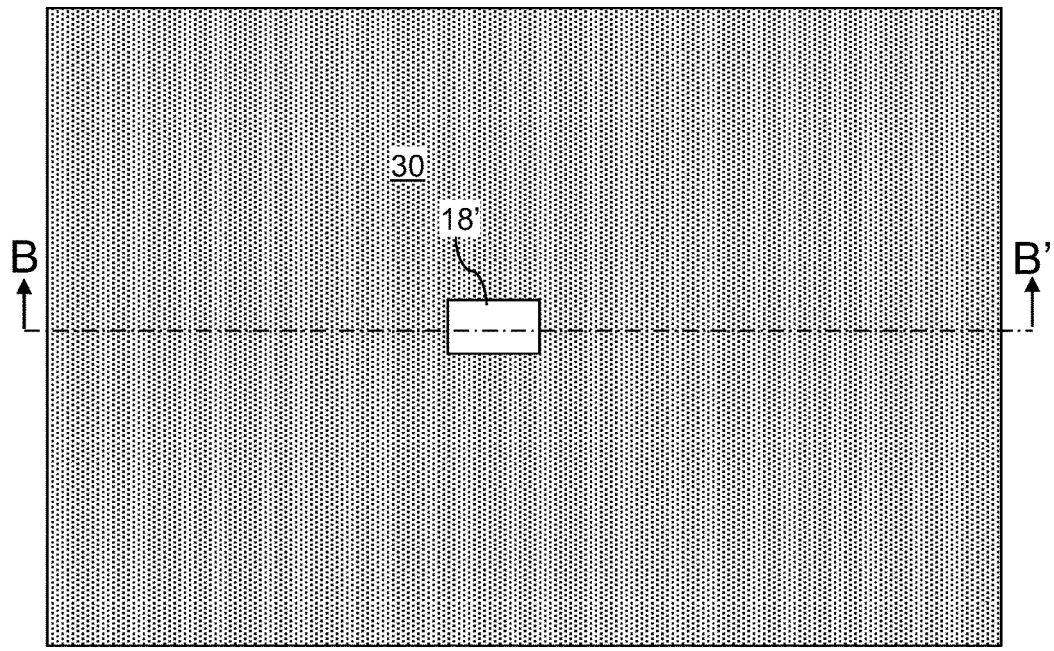
FIGS. 1A and 1B are views of an exemplary structure after formation of a via hole in a stack of a dielectric layer and a hard mask layer according to an embodiment of the present disclosure.

As stated above, the present disclosure relates to size-filtered multimetal structures in which metal lines having different widths have different metallic compositions, an electrically programmable fuse (eFuse) employing a different material for a metallic fuselink than for a metallic anode and a metallic cathode, and methods of manufacturing the same, which are now described in detail with accompanying figures. It is noted that like and corresponding elements mentioned herein and illustrated in the drawings are referred to by like reference numerals.

Figure 1B:
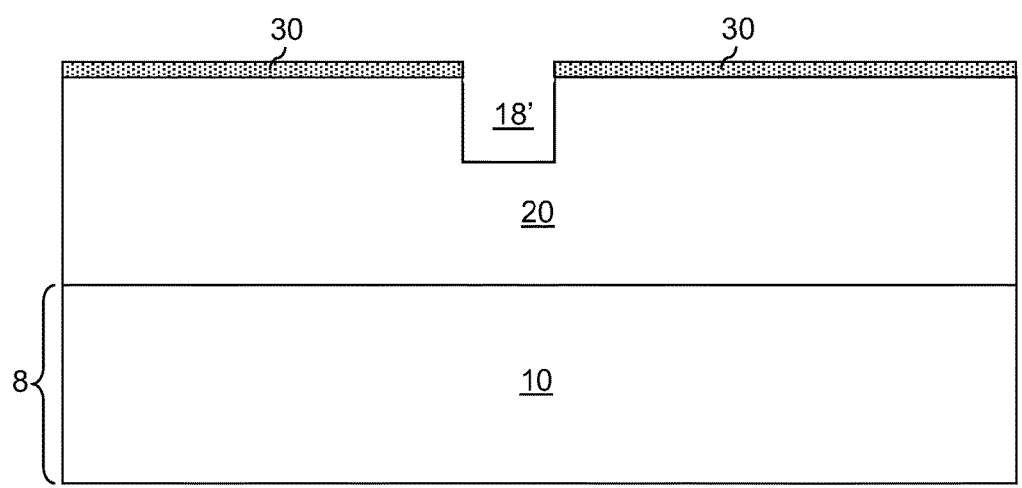

Referring to FIGS. 1A and 1B, an exemplary structure according to an embodiment of the present disclosure includes a substrate 10 and a dielectric layer 20 formed thereupon. The substrate 10 can be a semiconductor substrate including at least one semiconductor device such as a field effect transistor, or can be a combination of a semiconductor substrate and at least one metal interconnect structure. A metal interconnect structure includes a dielectric material layer and a metal line structures that provide electrical conductive paths in horizontal directions and metal via structures that provide electrically conductive paths in vertical directions. The dielectric material layer includes a dielectric material such as doped or undoped silicate glass, silicon nitride, silicon oxynitride, organosilicate glass (OGS), or a combination thereof.

The dielectric layer 20 is formed on the substrate 10 by deposition of a dielectric material, which can be doped or undoped silicate glass, silicon nitride, silicon oxynitride, organosilicate glass (OGS), or a combination thereof. The dielectric layer 20 can be deposited, for example, by chemical vapor deposition (CVD) or spin coating. The thickness of the dielectric layer 20 can be from 20 nm to 1,000 nm, although lesser and greater thicknesses can also be employed.

A dielectric hard mask layer 30 can be optionally deposited on the dielectric layer 20. The dielectric hard mask layer 30 includes a dielectric material having a greater resistance to abrasion than the dielectric material of the dielectric layer 20. The dielectric hard mask layer 30 can include, for example, silicon nitride layer or an organosilicate-based dielectric material such as BLoK™ and NBLoK™ available from Applied Materials, Inc. and including silicon, carbon, oxygen, hydrogen, and optionally nitrogen. The dielectric hard mask layer 30 can be deposited, for example, by chemical vapor deposition (CVD). The thickness of the dielectric hard mask layer 30 can be from 2 nm to 20 nm, although lesser and greater thicknesses can also be employed.

A via cavity 18' can be optionally formed in an upper portion of the dielectric layer 20. The via cavity 18' can be formed, for example, by applying a photoresist (not shown) on the top surface of the dielectric layer 20 or on the top surface of the dielectric hard mask layer 30, if present. The photoresist is subsequently lithographically exposed and developed, and the remaining portion of the photoresist can be employed as a masking layer to etch exposed portions of the dielectric hard mask layer 30 and/or the exposed portions of the dielectric layer 20. The photoresist can be subsequently removed, for example, by ashing.

While an embodiment that employs a dielectric hard mask layer 30 in the exemplary structure is described herein, embodiments in which the dielectric hard mask layer 30 is omitted can also be employed.

Figure 2A:
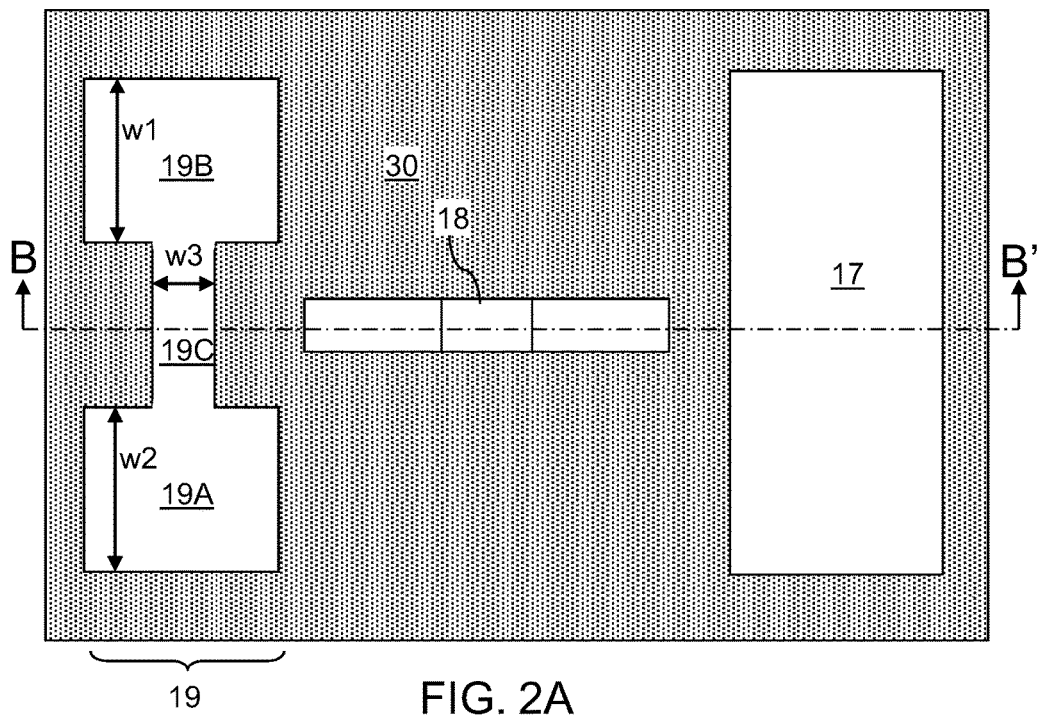
FIGS. 2A and 2B are views of the exemplary structure after formation of line trenches in the stack of the dielectric layer and the dielectric hard mask layer according to an embodiment of the present disclosure.
Figure 2B:
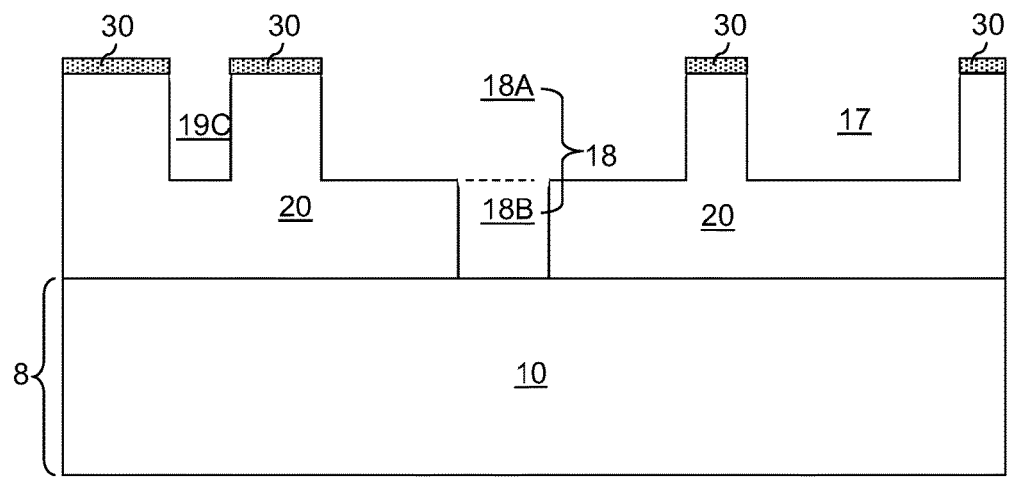

Referring to FIGS. 2A and 2B, trenches are formed in the stack of the dielectric layer 20 and the dielectric hard mask layer 30. The trenches can be line trenches. As used herein, a "line trench" refers to any trench located in a line level of a metal interconnect structure. Thus, the line trenches of the present disclosure can be formed concurrently with other trenches (not shown) that can be employed to form metal lines. The trenches may have a shape of a rectangle, a polygon, or any curved shape in a top-down view.

As used herein, a "width" of a trench refers to a least dimension between a pair of sidewalls that face the inside of the trench. For example, in a trench having a top-down shape of a rectangle, the width is the lesser of the two separation distances measured between opposing pairs of sidewalls of the trench.

The trenches include two types of trenches. A trench of a first type has a width that is greater than a lateral dimension. A trench of the first type is herein referred to as a "wide trench." A trench of a second type has a width that is equal to or less than the lateral dimension. A trench of the second type is herein referred to as a "narrow trench." The lateral dimension that distinguishes the first type of trenches and the second type of trenches is herein referred to as a "threshold distance." The threshold distance can be, for example, from 20 nm to 500 nm, although lesser and greater threshold distances can also be employed.

The trenches can be formed by applying a photoresist (not shown) over the dielectric hard mask layer 30, lithographically exposing and developing the photoresist, and anisotropically etching the exposed portions of the dielectric hard mask layer 30 and underlying upper portions of the dielectric layer 20. The photoresist is subsequently removed, for example, by ashing.

The trenches can include an integrated trench in which multiple types of trenches are laterally adjoined to each other or one another. For example, an integrated trench can include a first trench 19A, a second trench 19B, and a third trench 19C connected to the first and second trenches (19A, 19B). The first and second trenches (19A, 19B) have widths (e.g., w1 and w2, respectively) that are greater than the threshold distance. The third trench 19C has a width, e.g., w3, that is not greater than the threshold distance.

Further, the trenches can include a stand-alone second type trench 18, which is a trench of the second type that is not laterally adjoined to any trench of the first type. The stand-alone second type trench 18 can include a narrow trench line portion 18A and optionally at least one underlying narrow trench via portion 18B. In each of the narrow trench line portion 18A and the at least one underlying narrow trench via portion 18B, the width is not greater than the threshold distance, i.e., narrower than a lateral separation distance corresponding to the threshold distance. The at least one narrow trench via portion 18B can be formed by vertically extending at least one via cavities 18' that is formed at the processing step of FIGS. 1A and 1B.

Still further, the trenches can include a stand-alone first type trench 17, which is a trench of the first type that is not laterally adjoined to any trench of the second type. The stand-alone first type trench 17 can include a wide trench line portion (which coincides with the stand-alone first type trench 17 in FIGS. 2A and 2B) and optionally at least one underlying wide trench via portion (not shown). In each of the wide trench line portion and the at least one underlying wide trench via portion, the width is greater the threshold distance, i.e., wider than a lateral separation distance corresponding to the threshold distance.

Figure 3A:
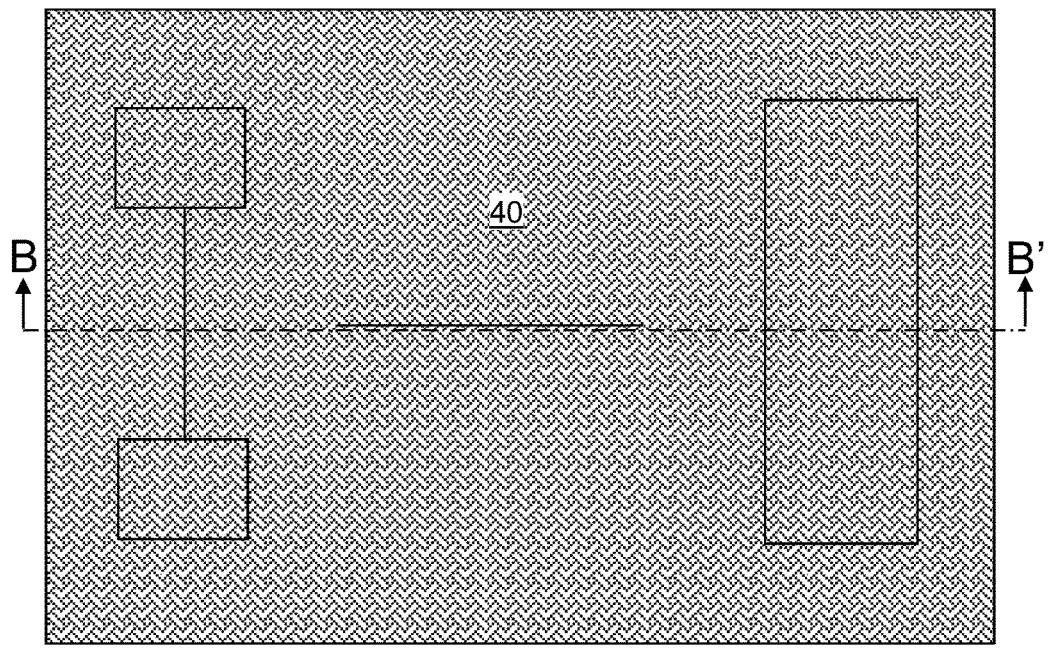
FIGS. 3A and 3B are views of the exemplary structure after formation of a blocking material layer according to an embodiment of the present disclosure.
Figure 3B:
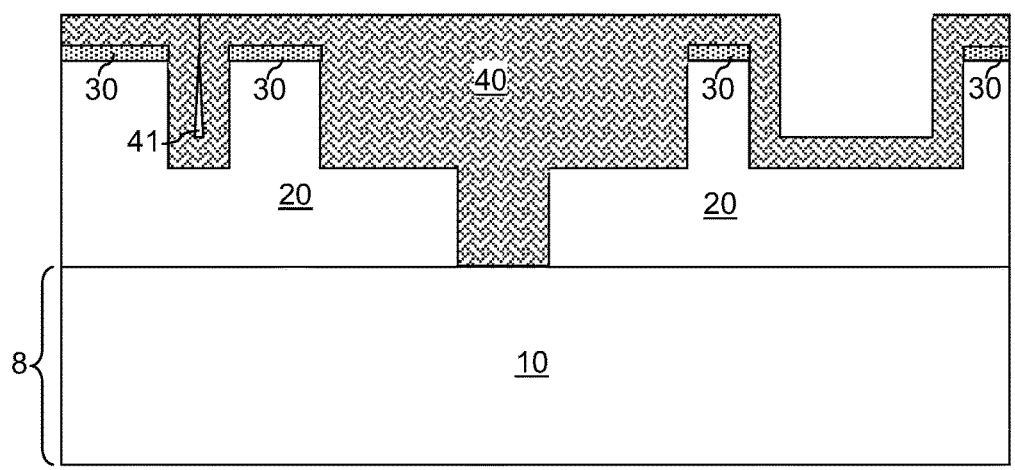

Referring to FIGS. 3A and 3B, a blocking material layer 40 is formed in the trenches (17, 18, 19A, 19B, 19C). The blocking material layer 40 includes a material that can be deposited conformally and is different from the materials of the dielectric hard mask layer 30 and the dielectric layer 20. For example, the blocking material layer 40 can include a material selected from parylene, organosilicate glass, silicon oxide, silicon nitride, at least one elemental semiconductor material, at least one compound semiconductor material, and a combination thereof.

The blocking material layer 40 is deposited as a conformal layer, i.e., a layer having substantially the same thicknesses at vertical portions and at horizontal portions. The blocking material layer 40 can be deposited, for example, by chemical vapor deposition (CVD) such as plasma enhanced chemical vapor deposition (PECVD) or low pressure chemical vapor deposition (LPCVD) or Atomic layer deposition (ALD). Depending on the conformity of the deposition process employed to form the blocking material layer 40 and any taper, if present, of the sidewalls of the trenches (17, 18, 19A, 19B, 19C), a cavity 41 may be formed within one or more of the trenches of the second type (18, 19C) directly underneath a seam at which two portions of the blocking material layer 40 make a lateral contact to seal off the cavity 41 at each trench of the second type.

In order to seal off upper portions of the trenches of the second type (18, 19C), the blocking material layer 40 is deposited conformally with a thickness that is greater than one-half of the threshold distance. The thickness of the blocking material layer 40 is selected to be less than one-half of the minimum widths of the trenches of the first type (17, 19A, 19B). Thus, the trenches of the first type do not include a seal-off region at which two portions of the blocking material layer 40 make a lateral contact. Consequently, all surfaces of the trenches of the first type are spaced from the surfaces of the blocking material layer 40 by a distance that is equal to the thickness of thinness of the blocking material layer 40.

Figure 4A:
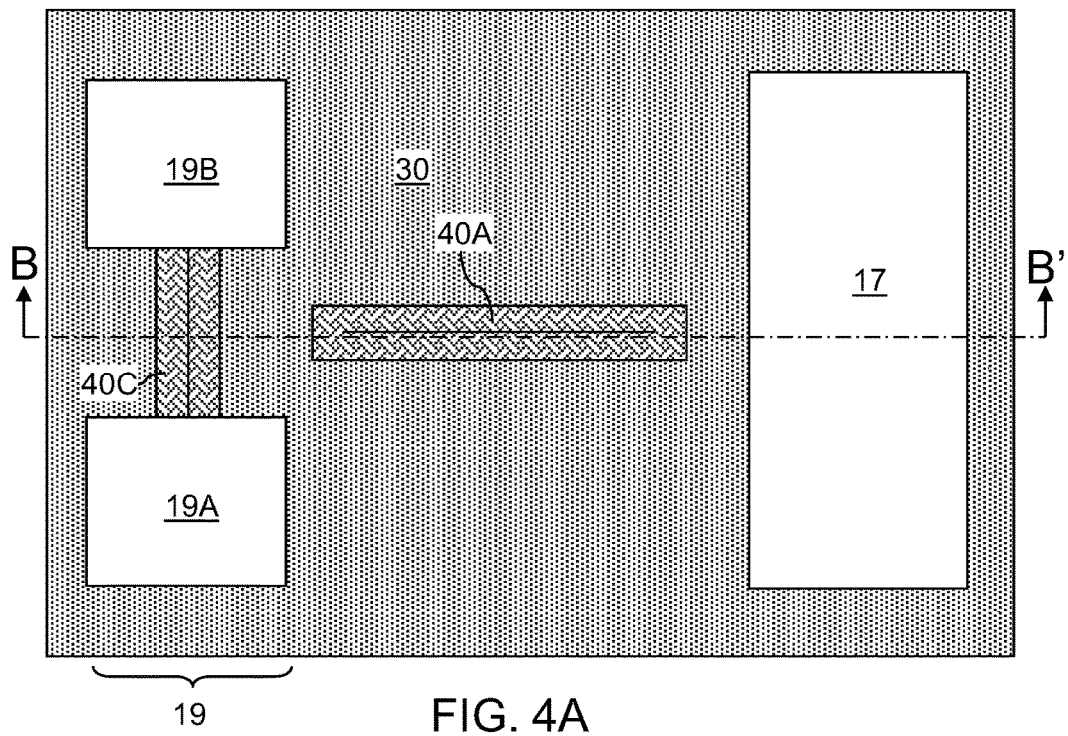
FIGS. 4A and 4B are views of the exemplary structure after removal of the blocking material layer from within wide trenches while the blocking material layer remains within narrow trenches according to an embodiment of the present disclosure.
Figure 4B:
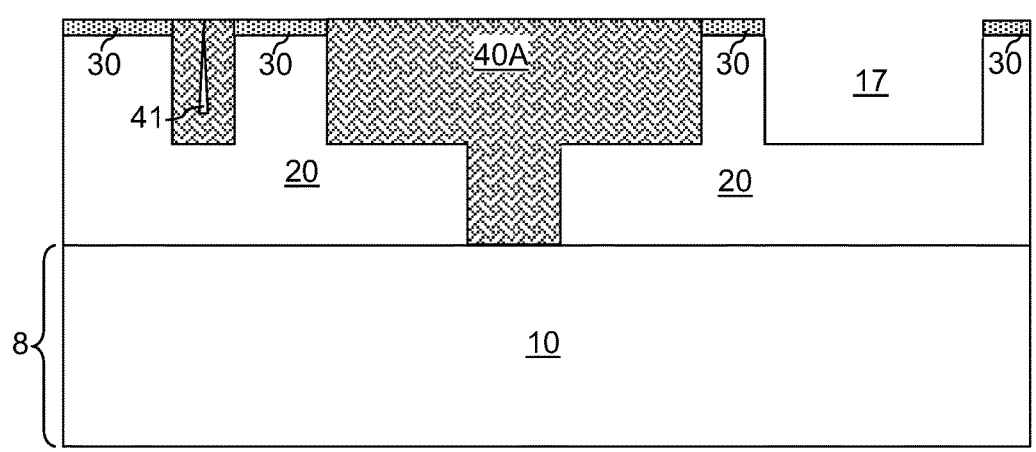

Referring to FIGS. 4A and 4B, portions of the blocking material layer 40 are isotropically recessed by a thickness that is at least equal to the thickness of the blocking material layer 40 as measured at the trenches of the first type (17, 19A, 19B). The amount of removal of the blocking material layer 40 is limited so that the blocking material layer 40 fills the trenches of the second type (18, 19C). Thus, the blocking material layer 40 is removed from within the wide trenches, i.e., trenches of the first type (17, 19A, 10B), and is not removed from within the narrow trenches, i.e., trenches of the second type (18, 19C).

The surfaces of the trenches of the first type (17, 19A, 19B) are physically exposed after the removal of the blocking material layer 40 from within the trenches of the first type (17, 19A, 19B). However, the trenches of the second type (18, 19C) are filled with the remaining portions of the blocking material layer 40. For example, the stand-alone second type trench 18 can be filled with a first blocking material portion 40A, and the third trench 19C can be filled with a second blocking material portion 40C. The first blocking material portion 40A and the second blocking material portion 40C have widths that do not exceed the threshold distance.

The blocking material layer 40 is removed completely from within the trenches of the first type (17, 19A, 19B) due to the ability of etchants to isotropically etch the blocking material layer 40 and expose the sidewalls and bottom surfaces of the trenches of the first type (17, 19A, 19B). Thus, all points on the sidewalls and bottom surfaces of the trenches of the first type (17, 19A, 19B) are separated from the outer surfaces of the blocking material layer 40 by a distance that does not exceed the etch distance, i.e. the distance of the isotropic etching during the isotropic etch process. The etch distance is greater than one-half of the threshold distance.

Figure 5A:
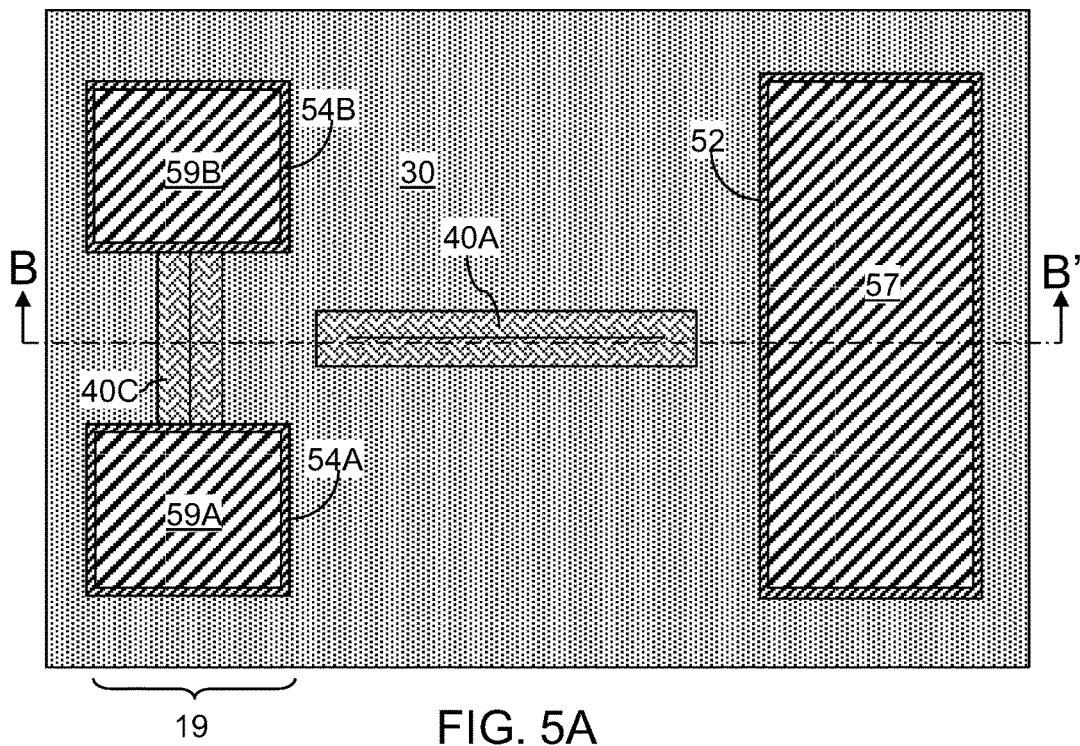
FIGS. 5A and 5B are views of the exemplary structure after formation of wide metallic structures according to an embodiment of the present disclosure.
Figure 5B:
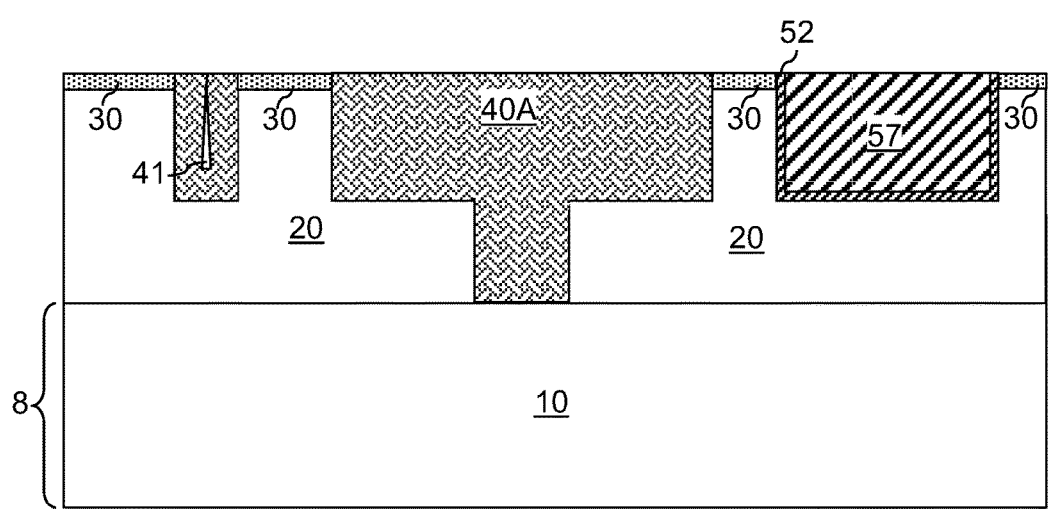

Referring to FIGS. 5A and 5B, metallic structures having a width greater than the threshold distance are formed by filling the trenches of the first type (17, 19A, 19B as shown in FIG. 4A) with a first metallic material. Metallic structures having a width greater than the threshold distance are herein referred to as "wide metallic structures."

For example, the wide metallic structures can be formed in the stand-alone first type cavity 17, the first trench 19A, and the second trench 19B. Specifically, the stand-alone first type cavity 17, the first trench 19A, and the second trench 19B can be filled with a first metallic material and excess portions of the first metallic material above the top surface of the dielectric hard mask layer 30 can be removed by planarization such as chemical mechanical planarization (CMP). The first metallic material can be any metal that has a greater electromigration resistance and a higher electrical resistivity than a second metallic material subsequently employed to fill trenches of the second type (18, 19C as shown in FIG. 2A), i.e., the narrow trenches. Exemplary first metallic materials include, but are not limited to, tungsten, titanium, iridium, and tantalum. The top surface of the dielectric hard mask layer 30 can be employed as a stopping layer during the planarization process. In embodiments in which a dielectric hard mask layer 30 is not employed, the top surface of the dielectric layer 20 can be employed as a stopping layer.

The portions of the first metallic material in the stand-alone first type cavity 17, the first trench 19A, and the second trench 19B are herein referred to as a stand-alone first metallic material portion 57, an anode-side first metallic material portion 59A, and a cathode-side first metallic material portion 59B, respectively. The topmost surfaces of the stand-alone first metallic material portion 57, the anode-side first metallic material portion 59A, and the cathode-side first metallic material portion 59B are coplanar with the top surface of the dielectric hard mask layer 30 if the dielectric hard mask layer 30 is present, and are coplanar with the topmost surface of the dielectric layer 20 if a dielectric hard mask layer is not present.

Optionally, at least one first metallic liner can be formed within the trenches of the first type (17, 19A, 19B). The at least one first metallic liner includes a first metallic liner material, which can be, but is not limited to, TiN, TaN, WN, TiC, TaC, WC, and combinations thereof. The thickness of the at least one first metallic liner can be from 2 nm to 20 nm, although lesser and greater thicknesses can also be employed. If the at least one first metallic liner is employed, a first metallic liner material is deposited on exposed surfaces of the dielectric layer 20 within the trenches of the first type (17, 19A, 19B) and over the top surface of the dielectric layer 20 and the remaining portions of the blocking material layer 40 (such as the first blocking material portion 40A and the second blocking material portion 40C) prior to deposition of the first metallic material described above. Portions of the first metallic liner material formed above the top surface of the dielectric hard mask layer 30 are removed during the planarization of the first metallic material.

The remaining portions of the first metallic liner material in the trenches of the first type (17, 19A, 19B) after the planarization of the first metallic material and the first metallic liner material constitute the at least one first metallic liner. The portions of the first metallic liner material in the stand-alone first type cavity 17, the first trench 19A, and the second trench 19B are herein referred to as a stand-alone first metallic liner 52, an anode-side first metallic liner 54A, and a cathode-side first metallic liner 54B, respectively. The topmost surfaces of the stand-alone first metallic liner 52, the anode-side first metallic liner 54A, and the cathode-side first metallic liner 54B are coplanar with the top surface of the dielectric hard mask layer 30 if the dielectric hard mask layer 30 is present, and are coplanar with the topmost surface of the dielectric layer 20 if a dielectric hard mask layer is not present. The outer sidewalls and bottom surfaces of the stand-alone first metallic liner 52, the anode-side first metallic liner 54A, and the cathode-side first metallic liner 54B contact sidewalls and horizontal surfaces of the dielectric layer 20. The inner sidewalls and top surfaces of the stand-alone first metallic liner 52, the anode-side first metallic liner 54A, and the cathode-side first metallic liner 54B contact sidewalls and horizontal surfaces of the stand-alone first metallic material portion 57, the anode-side first metallic material portion 59A, and the cathode-side first metallic material portion 59B, respectively.

If first metallic liners are present, each adjoined stack of a first metallic liner (52, 54B, 54C) and a first metallic material portion (57, 59A, 59B) is herein referred to as a "first metallic structure." If first metallic liners are not present, each first metallic material portion (57, 59A, 59B) is a first metallic structure.

Each first metallic structure (52, 54A, 54B, 57, 59A, 59B) is formed in a trench of the first type (17, 19A, 19B), from which the blocking material layer 40 is removed completely due to the ability of etchants to isotropically etch the blocking material layer 40. Thus, each first metallic structure (52, 54A, 54B, 57, 59A, 59B) includes at least one point located at a distance of more than one half of the threshold distance from any outer sidewall surface of that metallic structure.

Figure 6A:
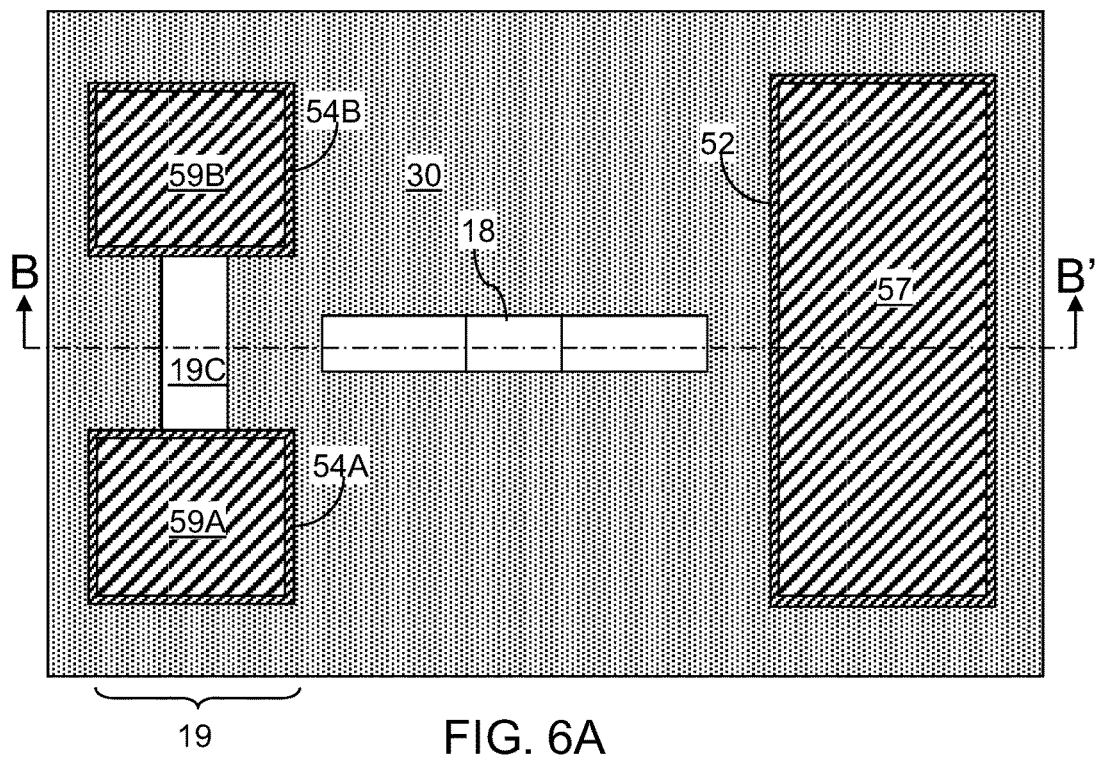
FIGS. 6A and 6B are views of the exemplary structure after removal of the blocking material layer from within narrow trenches according to an embodiment of the present disclosure.
Figure 6B:
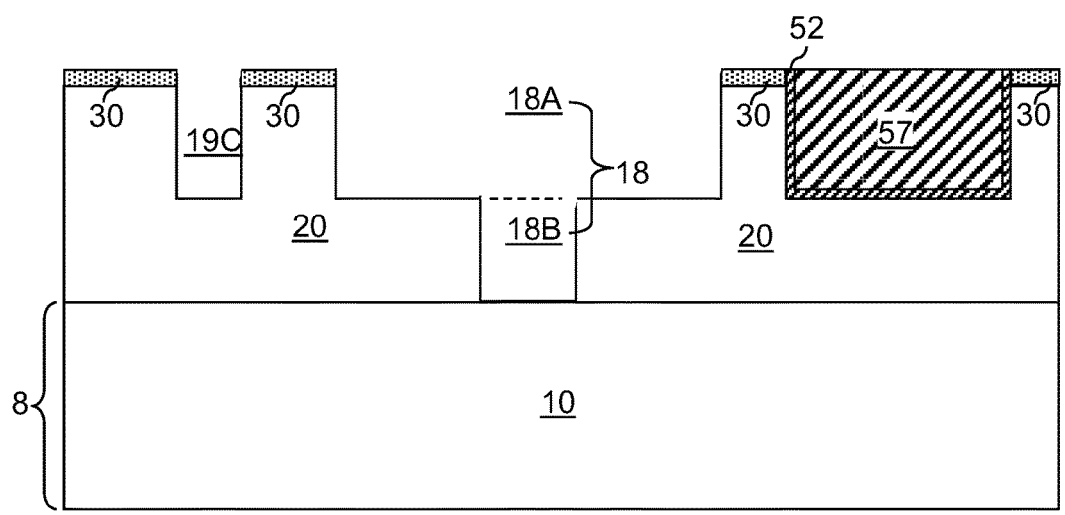

Referring to FIGS. 6A and 6B, the blocking material layer 40 is removed from within trenches of the second type (18, 19C) by an etch, which can be an isotropic etch or an anisotropic etch. An etch chemistry that removes the material of the blocking material layer 40 selectively to the materials of the first metallic structure (52, 54A, 54B, 57, 59A, 59B) and the dielectric layer 20 can be employed. Remaining portions of the blocking material layer 40 can be removed by this etch. Sidewall surfaces and bottom surfaces of the trenches of the second type (18, 19C).

Figure 7A:
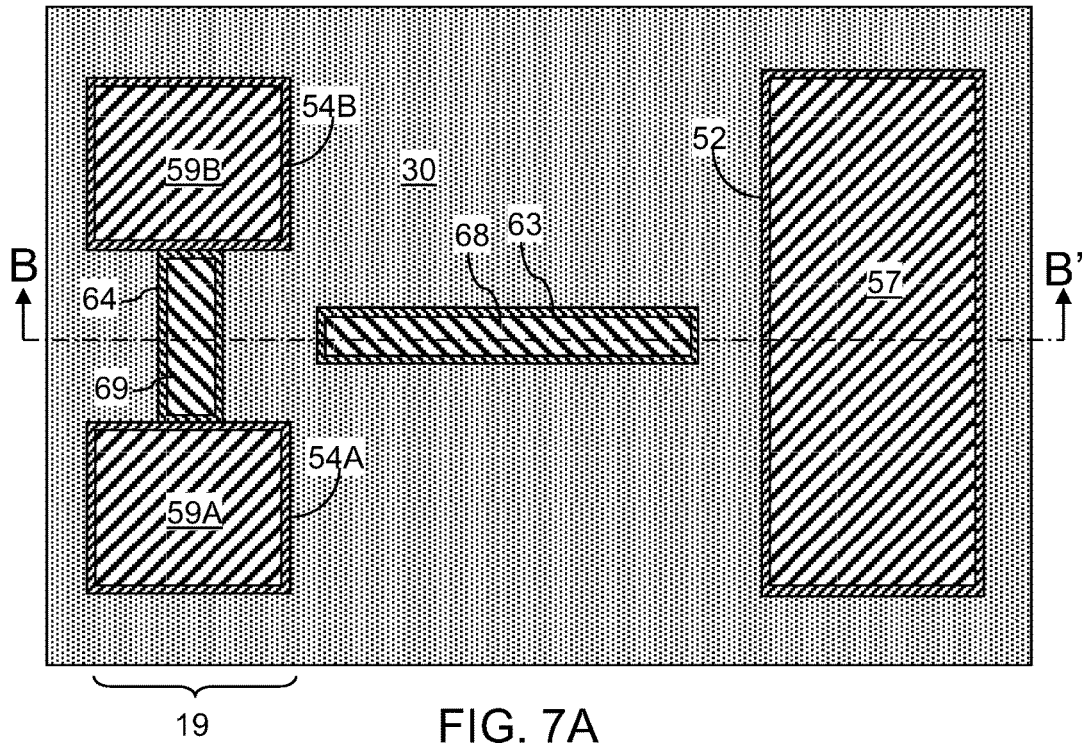
FIGS. 7A and 7B are views of the exemplary structure after formation of narrow metallic structures according to an embodiment of the present disclosure.
Figure 7B:
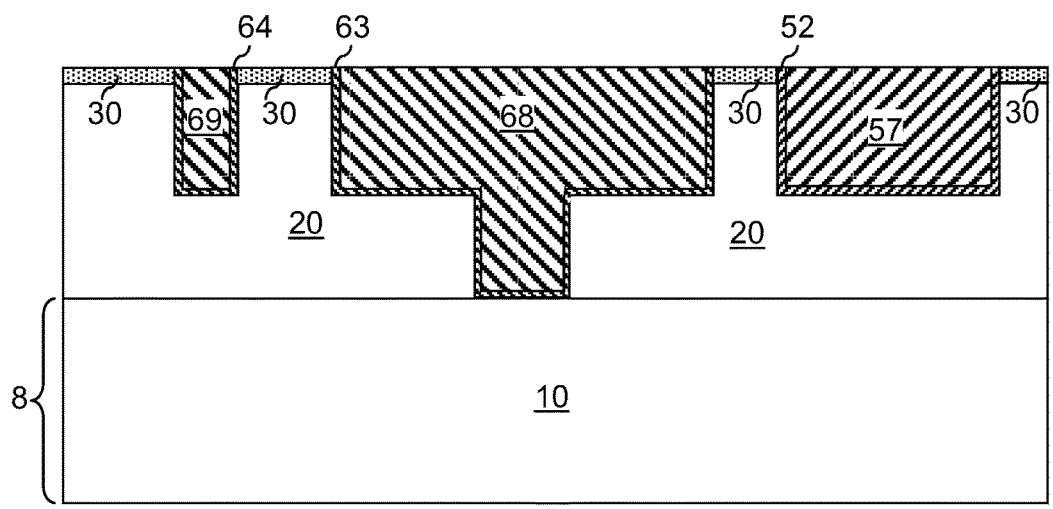

Referring to FIGS. 7A and 7B, metallic structures having a width less than the threshold distance are formed by filling the trenches of the second type (18, 19C as shown in FIG. 6A) with a second metallic material. Metallic structures having a width less than the threshold distance are herein referred to as "narrow metallic structures."

For example, the narrow metallic structures can be formed in the stand-alone second type cavity 18 and the third cavity 19C. Specifically, the stand-alone second type cavity 18 and the third trench 19C can be filled with the second metallic material and excess portions of the second metallic material above the top surface of the dielectric hard mask layer 30 can be removed by planarization such as chemical mechanical planarization (CMP). The second metallic material can include a highly electrically conductive metal such as, for example, copper, a copper alloy, or aluminum. The electrical resistivity of the highly electrical conductive metal that can be employed in the present application typically is less than 10 μΩ·cm. The top surface of the dielectric hard mask layer 30 can be employed as a stopping layer during the planarization process. In embodiments in which a dielectric hard mask layer 30 is not employed, the top surface of the dielectric layer 20 can be employed as a stopping layer.

The portions of the second metallic material in the stand-alone second type cavity 18 and the third trench 19C are herein referred to as a stand-alone second metallic material portion 68 and a fuselink second metallic material portion 69, respectively. The topmost surfaces of the stand-alone second metallic material portion 68 and the fuselink second metallic material portion 69 are coplanar with the top surface of the dielectric hard mask layer 30 if the dielectric hard mask layer 30 is present, and are coplanar with the topmost surface of the dielectric layer 20 if a dielectric hard mask layer is not present.

Optionally, at least one second metallic liner can be formed within the trenches of the second type (18, 19C). The at least one second metallic liner includes a second metallic liner material, which can be, but is not limited to, TiN, TaN, WN, TiC, TaC, WC, and combinations thereof. The thickness of the at least one second metallic liner can be from 2 nm to 20 nm, although lesser and greater thicknesses can also be employed. If the at least one second metallic liner is employed, a second metallic liner material is deposited on exposed surfaces of the dielectric layer 20 within the trenches of the second type (18, 19C) and over the top surface of the dielectric layer 20 and the first metallic structures (52, 54A, 54B, 57, 59A, 59B) prior to deposition of the second metallic material described above. Portions of the second metallic liner material formed above the top surface of the dielectric hard mask layer 30 are removed during the planarization of the second metallic material.

The remaining portions of the second metallic liner material in the trenches of the second type (18, 19C) after the planarization of the second metallic material and the second metallic liner material constitute the at least one second metallic liner. The portions of the second metallic liner material in the stand-alone second type cavity 18 and the third cavity 19C are herein referred to as a stand-alone second metallic liner 63 and a fuselink second metallic liner 64, respectively. The topmost surfaces of the stand-alone second metallic liner 63 and the fuselink second metallic liner 64 are coplanar with the top surface of the dielectric hard mask layer 30 if the dielectric hard mask layer 30 is present, and are coplanar with the topmost surface of the dielectric layer 20 if a dielectric hard mask layer is not present. The outer sidewalls and bottom surfaces of the stand-alone second metallic liner 63 and the fuselink second metallic liner 64 contact sidewalls and horizontal surfaces of the dielectric layer 20. The inner sidewalls and top surfaces of the stand-alone second metallic liner 63 and the fuselink second metallic liner 64 contact sidewalls and horizontal surfaces of the stand-alone second metallic material portion 68 and the fuselink second metallic material portion 69, respectively.

The first metallic structures (52, 54A, 54B, 57, 59A, 59B) and the second metallic structures (63, 64, 68, 69) have top surfaces that are coplanar with each other and with the top surface of the dielectric hard mask layer 30 if the dielectric hard mask layer 30 is present, or with the topmost surface of the dielectric layer 20 if a dielectric hard mask layer is not present.

If second metallic liners are present, each adjoined stack of a second metallic liner (63, 64) and a second metallic material portion (68, 69) is herein referred to as a "second metallic structure." If second metallic liners are not present, each second metallic material portion (68, 69) is a second metallic structure.

If at least one first metallic liner (52, 54A, 54B) and at least one second metallic liner (63, 64) are employed, the thickness of the at least one second metallic liner (63, 64) can be the same as, or can be different from, the thickness of the at least one first metallic liner (52, 54A, 54B).

Each second metallic structure (63, 64, 68, 69) is formed in a trench of the second type (18, 19C), in which portions of the blocking material layer 40 are present at the processing step of FIGS. 4A and 4B due to the inability of etchants to reach the inside of the trenches of the second type (18, 19C). Thus, for each point within the second metallic structures (63, 64, 68, 69), a minimum distance to outer sidewall surfaces of the second metallic structure (63, 64, 68, or 69) is not greater than one half of the threshold distance.

The various metallic structures (52, 54A, 54B, 57, 59A, 59B, 63, 64, 68, 69) can be combined to form a device structure. For example, the combination of the metallic structures within the integrated trench (19A, 19B, 19C) can be employed as an electrically programmable fuse (eFuse), which includes the optional anode-side first metallic liner 54A, the anode-side first metallic material portion 59A, the optional cathode-side first metallic liner 54B, the cathode-side first metallic material portion 59B, the optional fuselink second metallic liner 64, and the fuselink second metallic material portion 69. The combination of the anode-side first metallic liner 54A and the anode-side first metallic material portion 59A or the anode-side first metallic material portion 59A alone (if an anode-side first metallic liner 54A is not employed) constitutes a metallic anode (54A, 59A). The combination of the cathode-side first metallic liner 54B and the cathode-side first metallic material portion 59B or the cathode-side first metallic liner 54B alone (if a cathode-side first metallic liner 54B is not employed) constitutes a metallic cathode (54B, 59B). The combination of the fuselink second metallic liner 64 and the fuselink second metallic material portion 69 or the fuselink second metallic material portion 69 alone (if a fuselink second metallic liner is not employed) constitutes a metallic fuselink (64, 69). The topmost surfaces of the metallic fuselink (64, 69), the metallic anode (54A, 59A), and the metallic cathode (54B, 59B) are coplanar.

The metallic anode (54A, 59A) includes at least one point located at a distance of more than one half of the threshold distance from any outer sidewall surface of the metallic anode (54A, 59A) that contact the sidewalls of the first trench 19A, and the metallic cathode (54B, 59B) includes at least one point located at a distance of more than one half of the threshold distance from any outer sidewall surface of the metallic cathode (54B, 59B) that contact the sidewalls of the second trench 19B. For each point within the metallic fuselink (64, 69), a minimum distance to outer sidewall surfaces of the metallic fuselink (64, 69) is not greater than one half of the threshold distance.

In the present application, the first metallic material, which is present in the anode-side first metallic material portion 59A and the cathode-side first metallic material portion 59B, has a greater resistance to electromigration than the second metallic material, which is present in the fuselink second metallic material portion 69. In this case, the greater resistance to electromigration of the material of the anode-side first metallic material portion 59A and the cathode-side first metallic material portion 59B relative to the material of the fuselink second metallic material portion 69 can confine the electromigration within the electrically programmable fuse within the cathode-side first metallic material portion 59B.

Figure 8A:
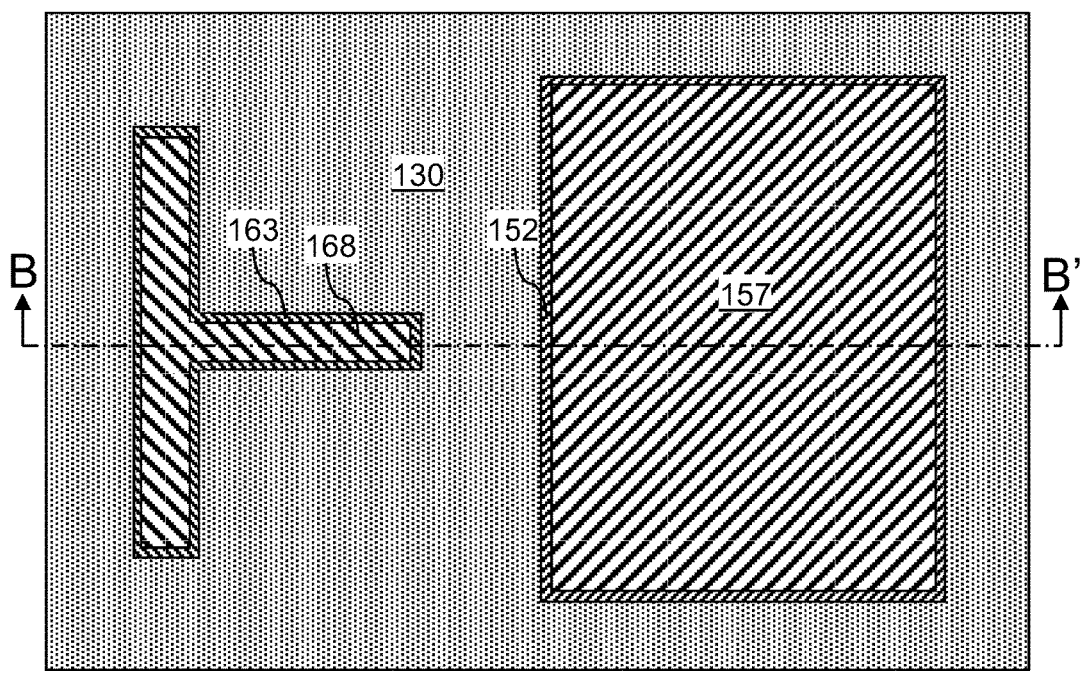
FIGS. 8A and 8B are views of the exemplary structure after formation of an overlying dielectric layer and additional wide and narrow metallic structures according to an embodiment of the present disclosure.
Figure 8B:
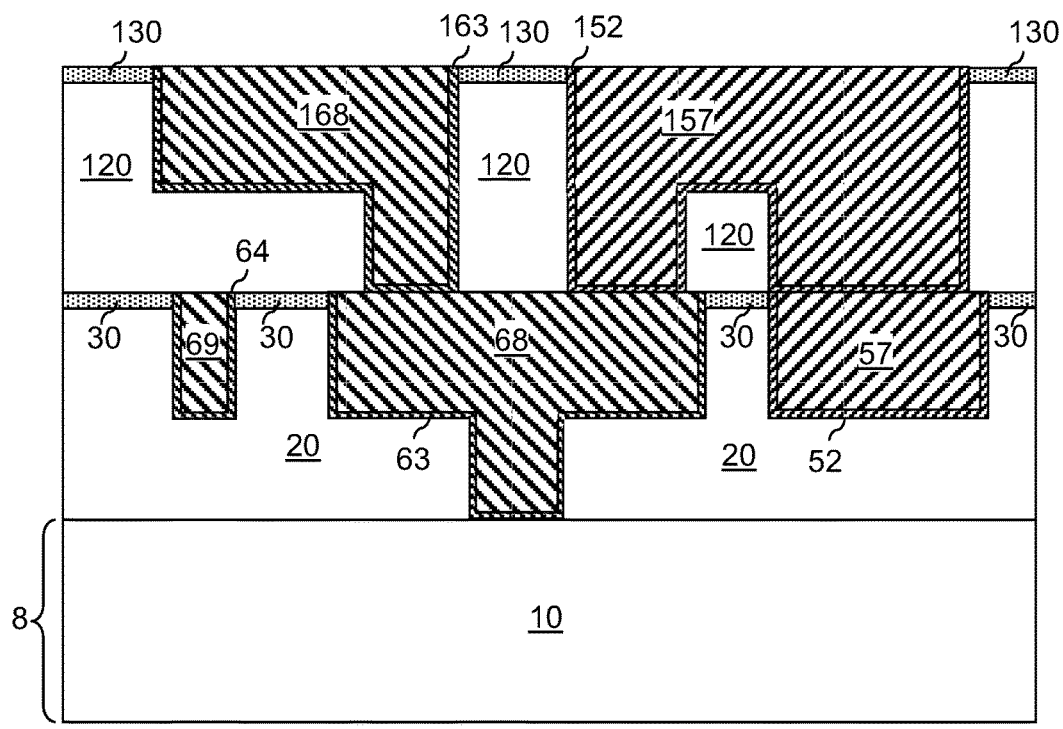

Referring to FIGS. 8A and 8B, an overlying dielectric layer 120 and an overlying dielectric hard mask layer 130 can be deposited over the exemplary structure shown in FIGS. 7A and 7B. The same processing methods of FIGS. 1A-7B can be employed at the level of the overlying dielectric layer 120 and the overlying dielectric hard mask layer 130 to form additional narrow metallic structures and additional wide metallic structures, which are embedded in the stack of the overlying dielectric layer 120 and the overlying dielectric hard mask layer 130. For example, each overlying wide metallic structure can include a first overlying metallic material portion 157 and a first overlying metallic liner 152, each of which includes a first metallic material and a first metallic liner material, respectively. Each overlying narrow metallic structure can include a second overlying metallic material portion 168 and a second overlying metallic liner 163, each of which includes a second metallic material and a second metallic liner material, respectively.

While the disclosure has been described in terms of specific embodiments, it is evident in view of the foregoing description that numerous alternatives, modifications and variations will be apparent to those skilled in the art. For example, though the present disclosure is described with exemplary structures including a field effect transistor and an antifuse structure, the present disclosure may be practiced without any field effect transistor. Accordingly, the disclosure is intended to encompass all such alternatives, modifications and variations which fall within the scope and spirit of the disclosure and the following claims.

What is claimed is:

1. A structure comprising:
   a dielectric layer located on a substrate;
   a first metallic structure located within a first trench that is embedded in said dielectric layer and has a first lateral width that is defined by opposite sidewalls of the first trench greater than a threshold distance, said first metallic structure comprising a first metallic portion including a first metallic material; and
   a second metallic structure located within a second trench that is embedded in said dielectric layer and has a second lateral width that is defined by opposite sidewalls of the second trench equal to or less than said threshold distance, said second metallic structure comprising a second metallic portion including a second metallic material having a lower electromigration resistance and a lower electrical resistivity than said first metallic material,
   wherein said first metallic structure fills an entirety of said first trench, and said second metallic structure fills an entirety of said second trench, wherein a topmost surface of said first metallic structure is coplanar with a topmost surface of said second metallic structure,
   wherein said first metallic structure further comprises a first metallic liner having a topmost surface that is coplanar with said topmost surface of said first metallic portion, and
   wherein said second metallic structure further comprises a second metallic liner having a topmost surface that is coplanar with said topmost surface of said second metallic portion, wherein said first metallic liner has a sidewall that is in direct physical contact with a sidewall of said second metallic liner.

2. The structure of claim 1, wherein said topmost surface of said first metallic structure and said topmost surface of said second metallic structure are coplanar with a top surface of said dielectric layer.

3. The structure of claim 1, further comprising a dielectric hard mask layer located over said dielectric layer, wherein said topmost surface of said first metallic structure and said topmost surface of said second metallic structure are coplanar with a top surface of said dielectric hard mask layer.

4. The structure of claim 3, wherein said dielectric hard mask layer comprises silicon nitride.

5. The structure of claim 1, wherein each of said at least one first metallic liner and said at least one second metallic liner comprises TiN, TaN, WN, TiC, TaC, WC, or a combination thereof.

6. The structure of claim 1, wherein, for each point within said second metallic structure, a minimum distance to outer sidewall surfaces of said second metallic structure is not greater than one half of said threshold distance, and said first metallic structure includes at least one point located at a distance of more than one half of said threshold distance from any outer sidewall surface of said first metallic structure.

7. The structure of claim 1, wherein said dielectric layer comprises doped or undoped silicate glass, silicon nitride, silicon oxynitride, organosilicate glass, or a combination thereof.

8. A structure comprising an electrically programmable fuse (eFuse), wherein said eFuse is embedded in a dielectric layer located on a substrate and comprises an assembly of a metallic anode, a metallic fuselink, and a metallic cathode, wherein said metallic anode comprises a first metallic portion located in a first trench that is embedded in said dielectric layer and including a first metallic material, said metallic cathode comprises a second metallic portion located in a second trench that is embedded in said dielectric layer and including said first metallic material, and said metallic fuselink contacts said metallic anode and said metallic cathode and comprises a third metallic portion located in a third trench that is embedded in said dielectric layer and including a second metallic material having a lower electromigration resistance and a lower electrical resistivity than said first metallic material, wherein said metallic anode has a first lateral width that is defined by opposite sidewalls of the first trench greater than a threshold distance, said metallic cathode has a second lateral width that is defined by opposite sidewalls of the first second trench greater than said threshold distance, and said metallic fuselink has a third lateral width that is defined by opposite sidewalls of the third trench equal to or less than said threshold distance, wherein said metallic anode fills an entirety of said first trench, said metallic cathode fills an entirety of said second trench, and said metallic fuselink fills an entirety of said third trench, and topmost surfaces of said metallic fuselink, said metallic anode, and said metallic cathode are coplanar with each other, and wherein said metallic anode further comprises a first metallic liner having a topmost surface that is coplanar with a topmost surface of said first metallic portion, said metallic cathode further comprises a second metallic liner having a topmost surface that is coplanar with a topmost surface of said second metallic portion, and said metallic fuselink further comprises a third metallic liner having a topmost surface that is coplanar with a topmost surface of said third metallic portion, wherein said first metallic liner has a sidewall that is in direct physical contact with a first sidewall of said second metallic liner, and wherein a second sidewall of said second metallic liner, that is opposite the first sidewall, directly contacts a sidewall of said third metallic liner.

9. The structure of claim 8, wherein said topmost surfaces of said metallic fuselink, said metallic anode, and said metallic cathode are coplanar with a top surface of said dielectric layer.

10. The structure of claim 8, further comprising a dielectric hard mask layer located over said dielectric layer, wherein said topmost surfaces of said metallic fuselink, said metallic anode, and said metallic cathode are coplanar with a top surface of said dielectric hard mask layer.

11. The structure of claim 10, wherein said dielectric hard mask layer comprises silicon nitride.

12. The structure of claim 8, wherein each of said at least one first metallic liner, said at least one second metallic liner, and said at least one third metallic liner comprises TiN, TaN, WN, TiC, TaC, WC, or a combination thereof.

13. The structure of claim 8, wherein, for each point within said metallic fuselink, a minimum distance to outer sidewall surfaces of said metallic fuselink is not greater than one half of said threshold distance, said metallic anode includes at least one point located at a distance of more than one half of said threshold distance from any outer sidewall surface of said metallic anode, and said metallic cathode includes at least one point located at a distance of more than one half of said threshold distance from any outer sidewall surface of said metallic cathode.

* * * * *